(12) United States Patent
Hebel et al.

(10) Patent No.: US 7,903,425 B2
(45) Date of Patent: Mar. 8, 2011

(54) INTEGRATED CIRCUIT CHIP THERMAL SOLUTION

(75) Inventors: Daniel Justin Hebel, Apex, NC (US); Clifford Allen Gaw, Durham, NC (US); Brinda Kumar Ramaiya, Cary, NC (US); James Stephen Rutledge, Durham, NC (US)

(73) Assignee: Lenovo (Singapore) Pte. Ltd., Singapore (SG)

( * ) Notice: Subject to any disclaimer, the term of this patent is extended or adjusted under 35 U.S.C. 154(b) by 1001 days.

(21) Appl. No.: 11/475,532

(22) Filed: Jun. 27, 2006

(65) Prior Publication Data

US 2007/0297155 A1    Dec. 27, 2007

(51) Int. Cl.
*H05K 7/02* (2006.01)
*H05K 7/06* (2006.01)
*H05K 7/08* (2006.01)
*H05K 7/10* (2006.01)

(52) U.S. Cl. .......................... 361/760; 361/704; 361/708

(58) Field of Classification Search .......... 361/700–710, 361/760–764
See application file for complete search history.

(56) References Cited

U.S. PATENT DOCUMENTS

| 5,856,911 | A  | * | 1/1999  | Riley           | 361/704 |
|-----------|----|---|---------|------------------|---------|
| 5,991,156 | A  | * | 11/1999 | Bond et al.      | 361/707 |
| 6,400,563 | B1 |   | 6/2002  | Mohi et al.      | 361/683 |
| 6,525,934 | B1 |   | 2/2003  | Nakanishi et al. | 361/687 |
| 6,545,351 | B1 | * | 4/2003  | Jamieson et al.  | 257/712 |
| 6,580,611 | B1 | * | 6/2003  | Vandentop et al. | 361/704 |
| 6,657,864 | B1 |   | 12/2003 | Dyckman et al.   | 361/704 |
| 6,861,750 | B2 | * | 3/2005  | Zhao et al.      | 257/739 |

FOREIGN PATENT DOCUMENTS

| JP | 05-037089   | 2/1993 |
|----|-------------|--------|
| JP | 09-036287   | 2/1997 |
| JP | 2001-244394 | 9/2001 |

* cited by examiner

*Primary Examiner* — Tuan T Dinh
(74) *Attorney, Agent, or Firm* — Lieberman & Brandsdorfer, LLC

(57) ABSTRACT

Heat from the core of a semiconductor chip package mounted on a printed circuit board assembled into a computer system is dissipated to both sides of the printed circuit board. A pair of integrated heat spreaders are disposed at opposite sides of the core, and two heat sinks are positioned at opposite sides of the package. Each of the heat sinks is positioned in thermal communication with one of the heat spreaders to dissipated heat from the core.

11 Claims, 4 Drawing Sheets

INTEGRATED CIRCUIT CHIP THERMAL SOLUTION

FIELD AND BACKGROUND OF INVENTION

This invention relates to dissipating heat from a semiconductor chip package mounted on a printed circuit board, such as in a computer system.

Heretofore, the problem of dissipating heat from a semiconductor chip package mounted on a printed circuit board has been widely recognized and a number of solutions have been implemented. The most common solution has been to mount a heat sink on a surface of the chip package spaced from the printed circuit board and provide thermal communication between the chip package and the heat sink. Heat is then transferred from the heat sink through radiation or convection, either to the surrounding environment or to a circulating fluid such as air (propelled by a fan) or liquid (in a heat pipe or circulated by a pump). Such solutions have been effective for the thermal demands placed by semiconductor chips up until recent times.

However, as power consumption for semiconductor chips, and particularly central processor chips for personal computer systems including desktop and notebook systems, has increased, the heat generated by such chips and requiring dissipation has risen. This has generated a need for a better and more effective heat dissipation solution.

SUMMARY OF THE INVENTION

With the foregoing in mind, it is a purpose of this invention to provide a new and more effective solution for dissipation of heat from a semiconductor chip package. In realizing this purpose, the present invention provides an approach which dissipates heat from the core of a chip to both sides of a printed circuit board on which the chip is mounted.

In addition, the present invention contemplates a method of mounting a semiconductor chip package for enhanced heat dissipation by which heat is dissipated from both sides of a printed circuit board on which the chip package is mounted.

BRIEF DESCRIPTION OF DRAWINGS

Some of the purposes of the invention having been stated, others will appear as the description proceeds, when taken in connection with the accompanying drawings, in which.

DETAILED DESCRIPTION OF INVENTION

While the present invention will be described more fully hereinafter with reference to the accompanying drawings, in which a preferred embodiment of the present invention is shown, it is to be understood at the outset of the description which follows that persons of skill in the appropriate arts may modify the invention here described while still achieving the favorable results of the invention. Accordingly, the description which follows is to be understood as being a broad, teaching disclosure directed to persons of skill in the appropriate arts, and not as limiting upon the present invention.

Figure 1:
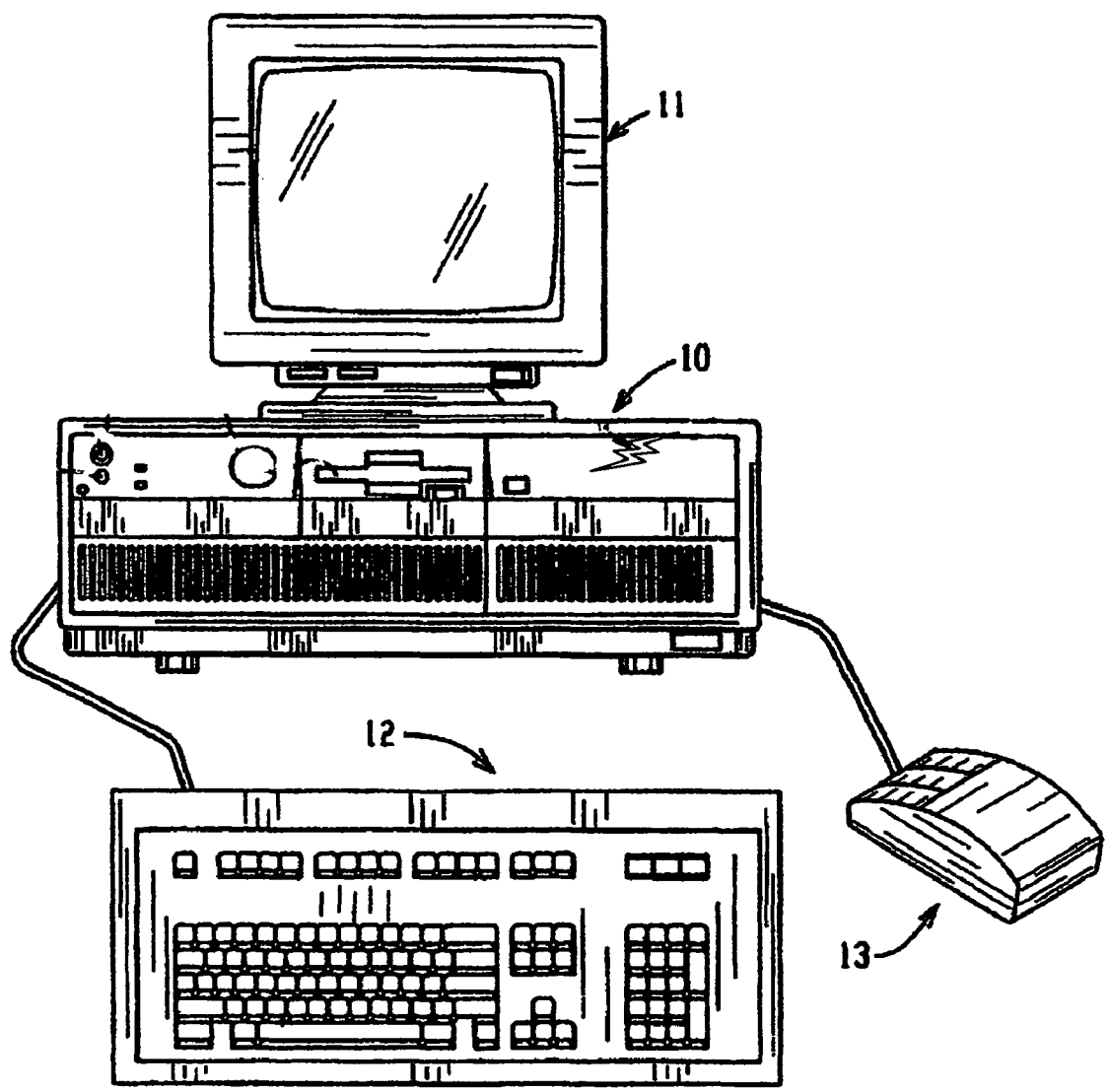
FIG. 1 is a perspective view of an illustrative embodiment of a computer system.

FIG. 1 illustrates a typical computer workstation, here a personal computer system 10. The system includes a central processor, memory accessible to the processor for storing data including programs to be executed, a display 11, input devices including a keyboard 12 and a pointing device (here shown as a mouse 13), a digital data storage device (commonly a hard disk drive) and output devices including a network interface, often known as a NIC. The NIC may implement network connectivity by a wired connection such as an Ethernet connection or by a wireless connection (indicated at 14 in FIG. 1) such as one of the IEEE 802.11 protocols. Such computer systems come in a variety of configurations, some known as notebook systems, others as desktop or deskside systems, some known as servers, and some known as "thin clients". The same technology appears in what are known as handheld computer systems (some of which are also known as PDAs or Personal Digital Assistants) and in certain telephone instruments such as cellular or smart telephones. The present invention may find usefulness with many such systems, depending upon the limitations of each such system, and it is to be understood that the choice of one type of such system for illustration is in no way limiting upon the implementation of this invention. Persons familiar with the arts of computer technology will easily recognize the scope of applicability of what is here described and illustrated. It is contemplated that the principal usefulness will be with user workstations connected with networks, also here called client systems.

Figure 2:
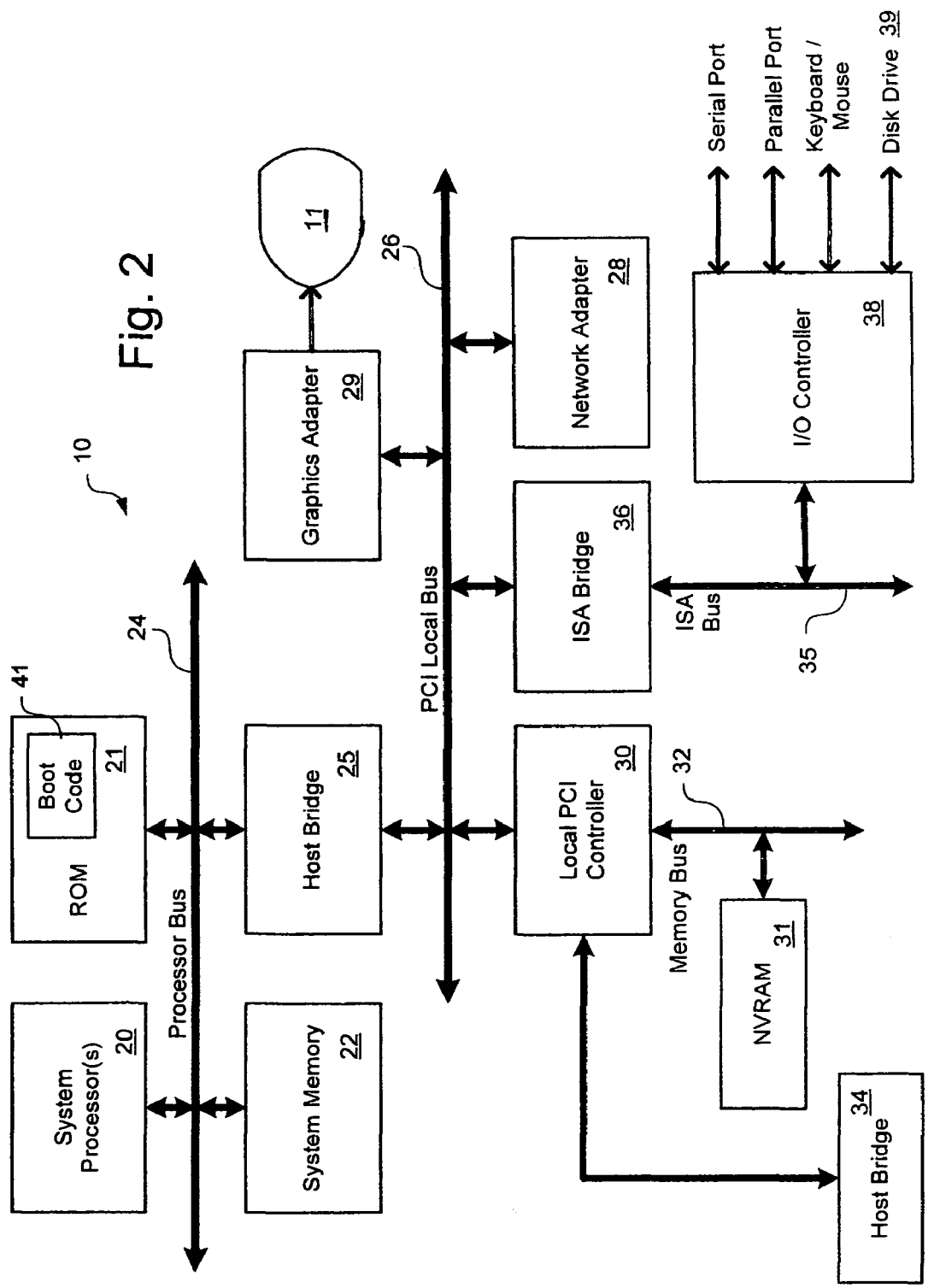
FIG. 2 is a block diagram representation of an illustrative computer system in which the present invention will have utility.

FIG. 2 is one illustrative embodiment of a computer system which may function as the system 10 of FIG. 1 and which includes a system processor or CPU 20, coupled to a Read-Only Memory (ROM) 21 and a system memory 22 by a processor bus 24. System processor 20 is a general-purpose processor that executes boot code stored within ROM 21 at power-on and thereafter processes data under the control of an operating system and application software stored in system memory 22. System processor 20 is coupled via the processor bus 24 and a host bridge 25 to a Peripheral Component Interconnect (PCI) local bus 26. The system processor, ROM, system memory and other devices may be semiconductors housed in conventional packages and mounted on a printed circuit board known as a motherboard.

The PCI local bus 26 supports the attachment of a number of devices, including adapters and bridges. Among these devices is a network adapter or NIC 28, which interfaces the computer system 10 to a LAN (wired or wireless), and graphics adapter 29, which interfaces the computer system 10 to the display 11. Communication on the PCI local bus 26 is governed by a local PCI controller 30, which is in turn coupled to non-volatile random access memory (NVRAM) 31 via a memory bus 32. Local PCI controller 30 can be coupled to additional buses and devices via a second host bridge 34.

Computer system 10 further may include an Industry Standard Architecture (ISA) bus 35, which is coupled to the PCI local bus 26 by an ISA bridge 36. Coupled to the ISA bus 35 is an input/output (I/O) controller 38, which controls communication between computer system 10 and attached peripheral devices such as a keyboard 12, mouse 13, and a disk drive 39 on which software is stored as digital data. In addition, I/O controller 38 supports external communication by computer system 10 via serial and parallel ports. Alternatively, more recently designed systems may use a PCI Express service for such functions as graphics.

Figure 3:
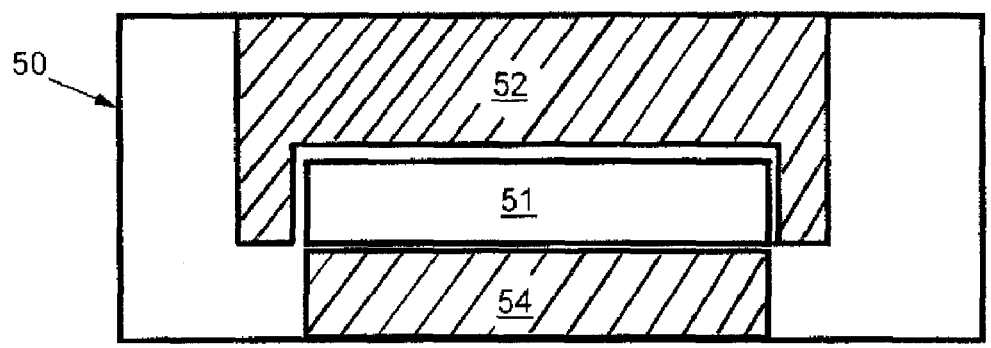
FIG. 3 is a sectional view showing a semiconductor chip package.

Referring now to FIG. 3, a semiconductor package 50 in accordance with this invention is there shown in section and elevation. The package includes a core 51, on which active elements such as gates and transistors are formed as is well known. The arrangement and manner of formation of such elements forms no part of the present invention and will not be described in detail, as the person of skill in the relevant technologies will well understand the technology and the range of choices available for design. The core 51 is enclosed within a suitable outer enclosure or package. In order to accomplish transfer of heat in as contemplated by this invention, integrated heat spreaders (IHS) 52, 54 are disposed between the core 51 and the outer surface or skin of the package. At least one of the spreaders 52 is thermally coupled to the core on at least three surfaces thereof. As illustrated in FIG. 3, the heat spreaders 52, 54 are shown as spaced slightly from the core 51. However, it should be noted that this is simply for clarity of illustration, as the spreaders either will be in intimate contact with the core or thermally coupled thereto by an appropriate heat conducting material such as a special grease or the like. Such materials are known to semiconductor fabricators. The other heat spreader 54 is shown as thermally coupled to only one surface of the core. However, designers will recognize that thermal coupling as here described may be done to six surfaces of the core and may be done by interleaving fingers or extensions of the two heat spreaders so as to maximise the pathways for heat transfer from the core.

Figure 4:
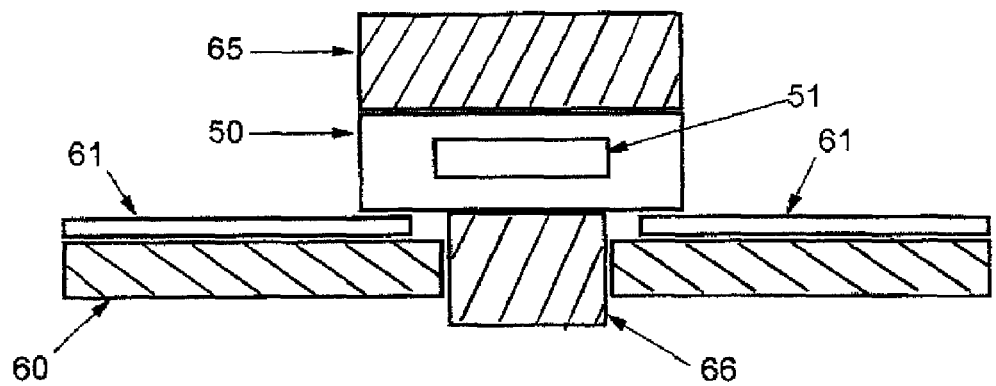
FIG. 4 is a sectional view showing a first solution in accordance with this invention.
Figure 5:
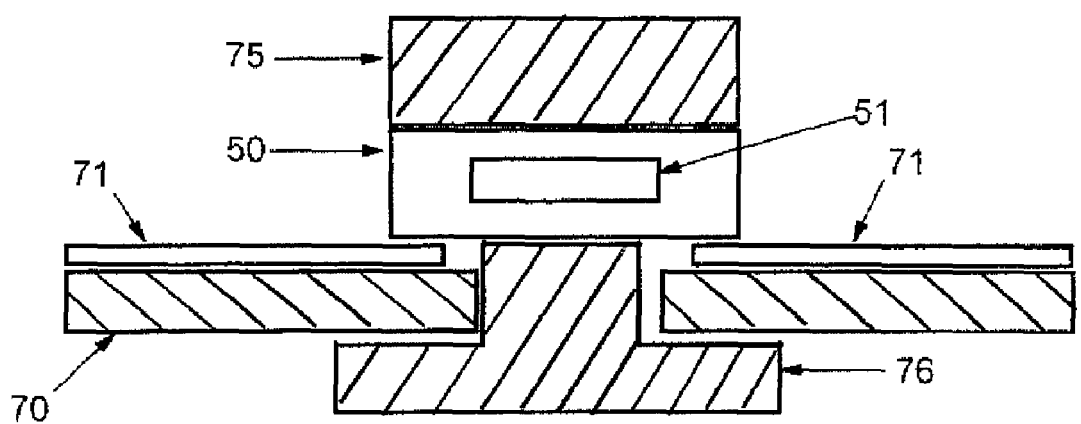
FIG. 5 is a sectional view showing a second solution in accordance with this invention.

The heat spreaders 52, 54, which are not shown in FIGS. 4 and 5 of the accompanying drawings simply as a matter of reducing the complexity of the Figures, function to transfer heat from the core 51 to the exterior of the package 50. As such semiconductor packages are commonly mounted on printed circuit boards for use and will be so mounted in the computer system of FIGS. 1 and 2, the discussion which follows turns to the mounting of a semiconductor package 50 as here described and the dissipation of heat generated in the core.

The present invention contemplates that heat be dissipated from both sides of a printed circuit board present in a combination of the package of this invention and a printed circuit board. One such implementation is shown in FIG. 4. There, a planar printed circuit board 60 has a plurality of conductive traces 61. A semiconductor chip package 50 is mounted on the printed circuit board 60 in electrical conducting association with the conductive traces 61. The chip package has a core 51 in which heat is generated. As mentioned above, the heat spreaders within the package are present but not illustrated in order to simplify the drawings as the package is shown on a reduced scale. The implementation has a pair of heat sinks 65, 66 in thermal communication with opposite sides of the package 50, with the heat sinks dissipating heat transferred from the core through the IHS toward opposite sides of the planar printed circuit board. One of the heat sinks is denominated an upper sink 65, and the other a lower sink 66.

In particular, the planar printed circuit board defines an opening and one of the heat sinks—the lower sink 66—extends through the opening. By this extension, the lower sink becomes exposed for transfer of heat away from the package 50.

In another implementation, shown in FIG. 5 in which comparable reference characters of a 70 series are applied, the lower sink 76 is aligned with the opening defined in the printed circuit board 70 but does not extend solely through that opening. Instead, the heat sink 76 has a protrusion that penetrates the opening to thermally contact the lower surface of the package 50. In addition, the printed circuit board 70 has a plurality of conductive traces 71.

The present invention contemplates that heat may be transferred from the heat sinks 65, 66, 75, 76 by any of the known techniques, such as radiation and convection by fluid flow, forced by an impeller or otherwise.

The present invention also contemplates a method of managing heat generation in which a planar printed circuit board is configured to have a plurality of conductive traces which pass electrical signals; a heat generating chip package is mounted on the planar printed circuit board in electrical conducting association with the conductive traces, the chip package which having a core and a pair of integrated heat spreaders in thermal communication with at least four surfaces of the core, and heat is dissipated from the core toward opposite sides of the planar printed circuit board. Such methods may include further features such as defining an opening in the planar printed circuit board and positioning a heat sink to extend through said opening. In another implementation, such a method may include configuring the integrated heat spreaders to define an upper heat spreader and a lower heat spreader; defining an opening in the planar printed circuit board; and aligning a lower heat sink with the opening. In the latter implementation, the method may further comprises positioning a lower heat sink in thermal communication with the lower heat spreader through the opening defined in the printed circuit board.

In the drawings and specifications there has been set forth a preferred embodiment of the invention and, although specific terms are used, the description thus given uses terminology in a generic and descriptive sense only and not for purposes of limitation.

What is claimed is:

1. An apparatus comprising:
    a computer system having a planar printed circuit board having a plurality of conductive traces which pass electrical signals;
    a semiconductor chip package mounted on said printed circuit board in electrical conducting association with said conductive traces; said chip package enclosing a core and a pair of integrated heat spreaders disposed at opposite sides of said core, wherein at least one of the heat spreaders is thermally coupled to at least three surfaces of the core; and
    two heat sinks positioned at opposite sides of the package, said heat sinks to dissipate heat from said core toward opposite sides of said printed circuit board.

2. The apparatus according to claim 1, wherein said planar printed circuit board defines an opening and further wherein one of said heat sinks extends through said opening.

3. The apparatus according to claim 1 wherein said heat sinks comprise an upper heat sink and a lower heat sink; said planar printed circuit board defines an opening; and said lower heat sink is aligned with said opening.

4. The apparatus according to claim 1 further comprising the lower heat sink in thermal communication with a lower heat spreader through an opening defined in said printed circuit board.

5. The apparatus according to claim 1, wherein said printed circuit board defines the opening and further comprising: a first heat sink is aligned with the opening and extends through said opening towards the package.

6. The apparatus according to claim 1, further comprising a second heat sink in thermal contact with one of said heat spreaders disposed at an upper surface of the package.

7. The apparatus according to claim 3, wherein the lower heat sink has a protrusion penetrating the opening in the printed circuit board, said protrusion in thermally contact with a lower surface of the package.

8. The apparatus according to claim 3, wherein the lower heat sink is in thermal contact with a lower surface of the printed circuit board.

9. An apparatus comprising:
- a computer system having a planar printed circuit board having a plurality of conductive traces which pass electrical signals;
- a semiconductor chip package mounted on said printed circuit board in electrical conducting association with said conductive traces; said chip package comprising a core and a pair of integrated heat spreaders disposed at opposite sides of said core, wherein at least one of the heat spreaders is thermally coupled to at least three surfaces of the core; and
- a lower heat sink and an upper heat sink positioned at opposite sides of the package, said lower heat sink having a protrusion penetrating an opening in the printed circuit board, said lower heat sink in thermal contact with one of said heat spreaders disposed at a lower surface of the package.

10. An apparatus comprising:
- a computer system having a planar printed circuit board having a plurality of conductive traces which pass electrical signals;
- a semiconductor chip package mounted on said printed circuit board in electrical conducting association with said conductive traces; said chip package comprising a core and a pair of integrated heat spreaders disposed at opposite sides of said core, including at least one of the heat spreaders is thermally coupled to at least three surfaces of the core;
- an upper heat sink in thermal communication with the upper heat spreader; and
- a lower heat sink positioned at an opposite side of the package from the upper heat sink, said lower heat sink having a middle section and two side sections, with the middle section penetrating an opening formed in the printed circuit board and in thermal contact with the lower heat spreader through the opening, and the two side sections in communication with a lower surface of the printed circuit board.

11. The apparatus of claim 10, further comprising the printed circuit board having an upper surface with a conductive trace, and the lower heat spreader in communication with the conductive trace.

* * * * *